United States Patent [19]
Fenk et al.

[11] Patent Number: 5,459,433
[45] Date of Patent: Oct. 17, 1995

[54] LOW-NOISE AMPLIFIER WITH REVERSIBLE AMPLIFICATION IN A CASCODE CIRCUIT

[75] Inventors: Josef Fenk, Eching; Siegfried Ganser, Maulet Schwaben, both of Germany

[73] Assignee: Siemens Aktiengesellschaft, Munich, Germany

[21] Appl. No.: 349,898

[22] Filed: Dec. 6, 1994

[30] Foreign Application Priority Data

Dec. 6, 1993 [DE] Germany ............... 43 41 507.5

[51] Int. Cl.$^6$ ............... H03G 3/30; H03F 3/45
[52] U.S. Cl. ............... 330/254; 330/278; 330/311
[58] Field of Search ............... 330/70, 71, 254, 330/278, 295, 311

[56] References Cited

U.S. PATENT DOCUMENTS 4,520,324  5/1985  Jett, Jr. et al. ............... 330/254

FOREIGN PATENT DOCUMENTS 3204430  8/1983  Germany.

*Primary Examiner*—James B. Mullins
*Attorney, Agent, or Firm*—Herbert L. Lerner; Laurence A. Greenberg

[57] ABSTRACT

A low-noise amplifier stage with reversible amplification includes a first series circuit of load paths of two transistors which is connected through a resistor to ground. A second series circuit or n series circuits of load paths of two transistors is likewise connected through a resistor to ground and is connected parallel to the first series circuit. Parallel-connected collectors of the first transistors of the series circuits are connected through an oscillator circuit to a supply voltage terminal. Two reference voltage sources are provided for supplying a first reference voltage to base terminals of the first transistors of the series circuits and for supplying a second reference voltage to base terminals of the second transistors of the series circuits. A reversing device connects a node point of the load paths of the transistors of the second series circuit to a supply voltage terminal as a function of a control signal.

3 Claims, 3 Drawing Sheets

5,459,433

LOW-NOISE AMPLIFIER WITH REVERSIBLE AMPLIFICATION IN A CASCODE CIRCUIT

BACKGROUND OF THE INVENTION

1. Field of the Invention

The invention relates to a low-noise amplifier stage with reversible amplification in a cascode circuit, having a reference voltage source.

Such a differential amplifier, which has a cascode stage and a reference voltage source, is known from German Published, Non-Prosecuted Application DE 32 04 430 A1.

Low-noise amplifier stages of that kind are used especially in high-frequency technology for reception circuits, such as in mobile radios for frequency ranges of up to 2 GHz, for instance.

The demands made of such amplifier circuits are that they be integratable and be operable with a low supply voltage, and that the amplification be reversible, while integrated triggering of the switching state remains assured.

Until now, such low-noise preamplifiers were made up separately of high-quality individual semiconductors.

SUMMARY OF THE INVENTION

It is accordingly an object of the invention to provide an integratable amplifier stage, which overcomes the hereinafore-mentioned disadvantages of the heretofore-known devices of this general type and which has reversible amplification.

With the foregoing and other objects in view there is provided, in accordance with the invention, a low-noise amplifier stage with reversible amplification in a cascode circuit, having a reference voltage source, comprising a reference potential terminal; one first transistor and one second transistor having base terminals and having collector and emitter terminals defining load paths, a first resistor, the load paths of the one first and the one second transistors and the first resistor forming a first series circuit connected to the reference potential terminal; at least one other first transistor and at least one other second transistor having base terminals and having collector and emitter terminals defining load paths being interconnected at least at one node point, at least one second resistor, the load paths of the at least one other first and the at least one other second transistors and the at least one second resistor forming at least one second series circuit connected to the reference potential terminal, the at least one second series circuit being connected parallel to the first series circuit; a supply voltage terminal; an oscillator circuit connected to the supply voltage terminal; an output terminal connected through the oscillator circuit to the supply voltage terminal; the collector terminals of the first transistors being connected parallel to the series circuits and being coupled to the output terminal; first and second reference voltage sources, the first reference voltage source supplying the base terminals of the first transistors of the series circuits, and the second reference voltage supplying the base terminals of the second transistors of the series circuits; an input terminal being coupled to the base terminals of the second transistors of the series circuits; and at least one reversing means connecting the at least one node point of the load paths of the transistors of the at least one second series circuit to the supply voltage terminal as a function of a control signal.

In accordance with another feature of the invention, the parallel-connected at least one first and at least one second transistors of the at least one second series circuit are a multiplicity of parallel-connected first and second transistors of a multiplicity of second series circuits.

In accordance with a concomitant feature of the invention, there is provided a choke connected between the second reference voltage source and the base terminals of the second transistors of the series circuits.

An advantage of the invention is that when the amplification changes, the input impedance of the circuit is virtually unchanged.

Other features which are considered as characteristic for the invention are set forth in the appended claims.

Although the invention is illustrated and described herein as embodied in an amplifier stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
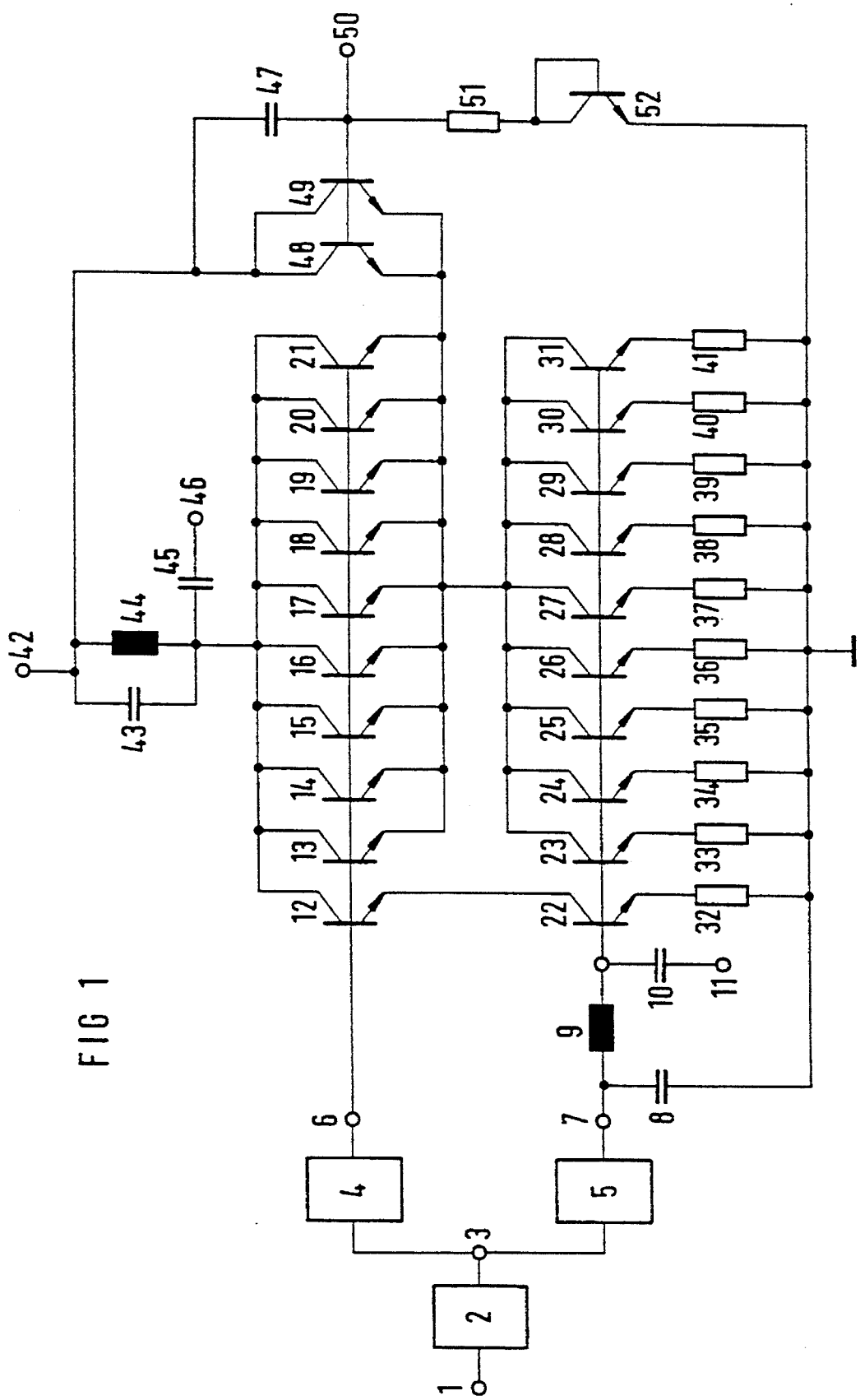
FIG. 1 is a schematic circuit diagram of an embodiment of a circuit configuration according to the invention.

Referring now to the figures of the drawing in detail and first, particularly, to FIG. 1 thereof, it is seen that, by way of example, reference numeral 1 indicates a supply voltage terminal that supplies a reference voltage source 2.

A reference voltage of the reference voltage source 2 can be picked up at a terminal 3 and is supplied to first and second reference voltage sources 4 and 5. The first and second reference voltage sources 4 and 5 have respective outputs 6 and 7 at which they generate respective first and second mutually independent reference voltages. The first reference voltage at the output terminal 6 is supplied to base terminals of first npn transistors 12–21. Collectors of the transistors 12–21 are connected to one another and they are also connected through a parallel oscillator circuit 43, 44, which may be coupled to the circuit externally, to a further supply voltage terminal 42. This supply voltage terminal 42 can also be identical to the supply voltage terminal 1. An output terminal 46 is also connected through a capacitor 45 to the interconnected collectors of the transistors 12–21.

The second reference voltage that can be picked up at the output terminal 7 is supplied through a choke coil 9 to base terminals of second npn transistors 22–31. A collector of the transistor 22 is connected to an emitter of the transistor 12. Collectors of the transistors 23–31 and emitters of the transistors 13–21 are connected to one another. Each emitter of the transistors 22–31 is connected to ground or to a reference potential terminal through a respective first resistor 32 or second resistor 33–41. An input terminal 11 is connected through a capacitor 10 to the base terminals of the transistors 22–31. The output terminal 7 of the second reference voltage source 5 is also connected to ground through a capacitor 8. The supply voltage terminal 42 is connected through a capacitor 47 to a control input terminal 50. The supply voltage terminal 42 is also connected to collectors of transistors 48 and 49. Base terminals of transistors 48 and 49 are connected to the control input terminal 50. Emitters of transistors 48 and 49 are connected to the emitters of transistors 13–21. The control input terminal 50 is connected through a series circuit including a resistor 51 and a diode 52 which is switched in the flux direction, to ground. Therefore, the load paths of the first transistor 12, the second transistor 22 and the first resistor 32 form a first series circuit connected to the reference potential terminal. A second series circuit is formed of the load paths of the first transistor 13, the second transistor 23 and the second resistor 33. Other second series circuits being formed of the other first and second transistors and the other second resistors are also shown.

As was already mentioned above, all of the elements except for the capacitors 8, 10, 45 and 47 and the two coils 9 and 44, by way of example, are integratable.

The reference voltage at the output terminal 3 may be temperature-independent and supply voltage-independent, for instance through a bandgap circuit. This reference voltage then serves to generate the two further reference voltages at the output terminals 6 and 7. The reference voltage at the output terminal 7 passes through the choke 9 and reaches a first input of a differential amplifier stage formed by the transistors 12–31. The reference voltage at the output terminal 6 is supplied directly to a second input of the differential amplifier stage, and a capacitor 72 shown in FIG. 3 serves to provide the still-frequent grounding of the bases in the transistors 12–21. An amplification of the differential amplifier stage can be switched through the input terminal 50. A frequency signal to be amplified is fed in at the input terminal 11 and damped or amplified through the cascode stage. In the example, this may be −5 dB or +15 dB, for instance. This signal passes through the interconnected collectors of the transistors 12–21 and reaches the outside at the external oscillator circuit 43, 44 for selective decoupling. The oscillator circuit 43, 44 is connected to the supply voltage and it determines the maximum amplification of the low-noise amplifier through the use of its quality and the decoupling being used.

The capacitor 47 serves to block out undesired interference, and the resistors 32–41 serve to increase the negative current feedback of, or in other words to linearize, the lower cascode transistors 22–31. The combination of the resistor 51 and the transistor 52, which is switched as a diode, pulls the potential at the control input terminal 50, with the triggering turned off, to approximately 0.5 V, which is equivalent to a logical "0" level and which thus turns on the maximum amplification of the low-noise amplifier.

Adjustment of the amplification is attained by interrupting the collector lines of the transistor 22, or of transistors 23–31, through the cascode transistor 12, or the cascode transistors 13–21, respectively. If the transistors 48 and 49 are in the blocking state, then the entire direct and alternating signal current flows through the collector lines of the transistors 22–31 and through those of transistors 12–21 to the output, or in other words to the short-circuited collectors of the transistors 12–21. This is equivalent to the state of maximum amplification. If a switchover to minimum amplification is made through the switch input 50 by means of a high level, then the direct and alternating collector current of the transistors 23–31 flows out through the cascode transistors 48 and 49, while the transistors 13–21 are blocked, so that only the direct and alternating current portions of the transistor 22 can flow out at the output through the transistor 12. The splitup of the collector lines of the transistors 22–31 has been adjusted in the example shown to an amplification change value of 20 dB.

However, any arbitrary other split can be chosen, depending on the change in amplification. In the same way, the number of parallel transistors can be split up, in order to attain a desired change in amplification in a plurality of values of amplification adjustment.

Figure 2:
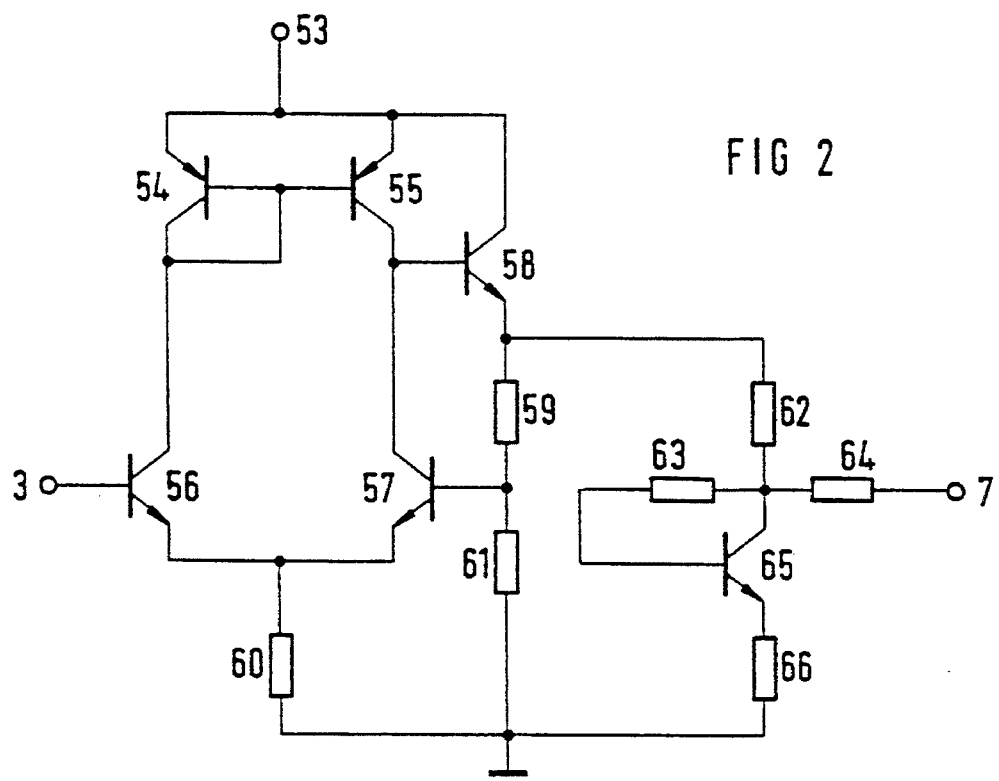
FIG. 2 is a circuit diagram of a first reference voltage source.

FIG. 2 shows an embodiment of a reference voltage source which may be used for the second reference voltage source 5 of FIG. 1. This reference voltage source has a supply voltage terminal 53, which may be identical to the supply voltage terminal 42 or 1 of FIG. 1. This terminal 53 is connected to emitters of two pnp transistors 54 and 55. Base terminals of the two transistors 54 and 55 are connected both to one another and to a collector of the transistor 54. The collector of the transistor 54 is also connected to a collector of an npn transistor 56. A base of the transistor 56 is connected to the input terminal 3. A collector of the transistor 55 is connected to a collector of an npn transistor 57. An emitter of the transistor 57 is connected to an emitter of the transistor 56 and is connected through a resistor 60 to ground. The supply voltage terminal 53 is also connected to a collector of an npn transistor 58. An emitter of that transistor is connected through a resistor 59 to a base of the transistor 57. A base of the transistor 58 is connected to the collector of the transistor 55. The base of the transistor 57 is connected through a resistor 61 to ground. The output signal of the reference voltage source is picked up at the emitter of the transistor 58 and is supplied to the output terminal 7 through a series circuit of two resistors 62 and 64. A collector of an npn transistor 65 is connected to a node point or junction of the series circuit of the resistors 62 and 64. A base of the transistor 65 is connected through a resistor 63 to its collector. An emitter of the transistor 65 is connected through a resistor 66 to ground.

The reference voltage source shown in FIG. 2 serves to adjust the operating points of the transistors 22–31. This is achieved by means of the transistor 65, through a thermally coupled current mirror circuit. The bases of the transistors 22–31 are then supplied through the resistor 64 and the external choke element 9. The resistor 66 preferably has the same resistance as the resistors 32–41, and the resistor 63 preferably has 10 times the resistance of the resistor 64.

Figure 3:
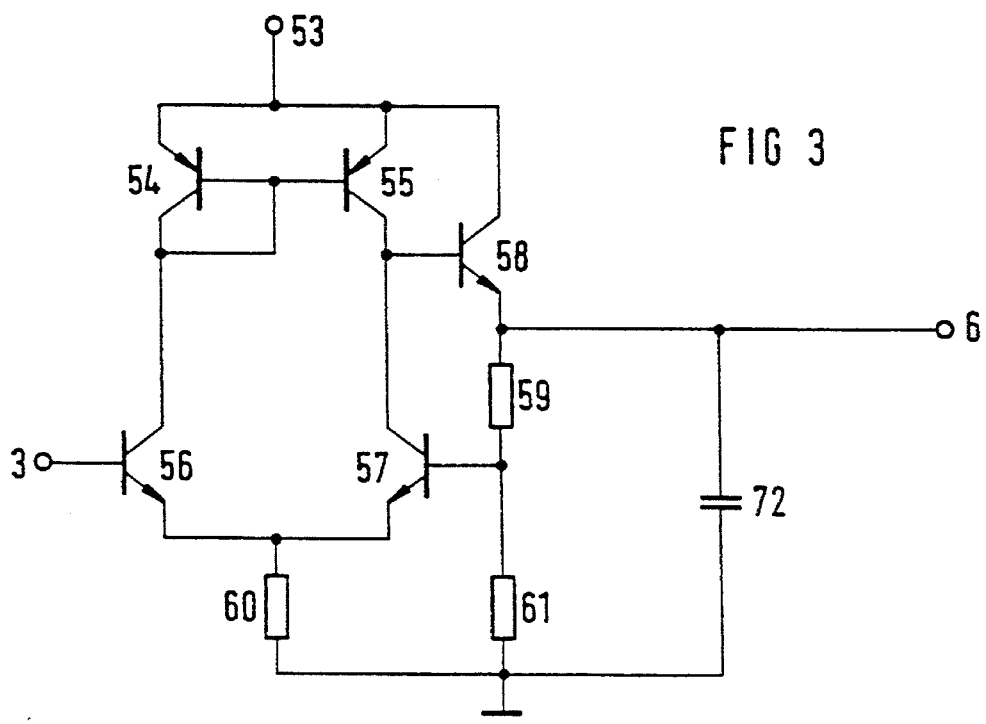
FIG. 3 is a circuit diagram of a second reference voltage source.

FIG. 3 shows an embodiment of a reference voltage source which may be used for the first reference voltage source 4 in FIG. 1. The configuration is essentially equivalent to that of FIG. 2, so that identical elements have the same reference numerals. However, in the reference voltage source of FIG. 3, the output voltage at the emitter of the transistor 58 is supplied directly to the output terminal 6. An integratable capacitor 72, which serves to block out undesired interference, is connected between the output terminal 6 and ground.

According to a further feature of the invention, a number of other switchable amplifier stages corresponding to the amplifier stage having the transistors 13–21 and 23–31 and the associated trigger stages 47–52 of FIG. 1 may be connected in parallel, in order to assure a graduated switchable amplification. The amplifier stage may include two transistors or other transistors connected parallel thereto, depending on the degree of amplification.

Figure 4:
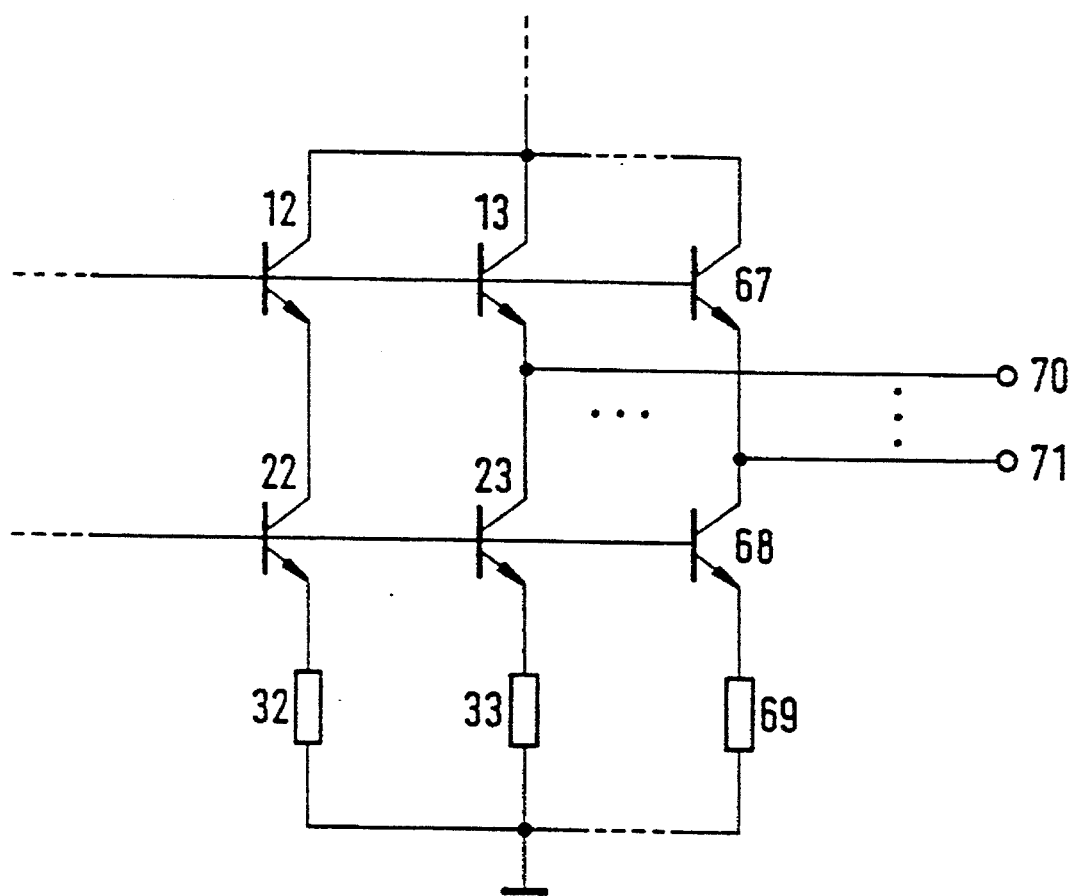
FIG. 4 is a circuit diagram of a further embodiment of a circuit configuration according to the invention.

One such configuration is shown in FIG. 4. The switchable differential amplifier of FIG. 1 is shown only in part in FIG. 4. Identical elements have the same reference numerals. The second differential amplifier stage in this case includes only two series-connected transistors 13 and 23, for instance. In addition, other switchable stages are provided. However, only one further circuit is shown, which is connected parallel to the other two stages and includes load paths of transistors 67 and 68 and a resistor 69. A node point or junction of the load paths of the transistors 13 and 23 is triggered symbolically through a terminal 70. By way of example, a configuration according to FIG. 1 having the elements 47–52 may be provided therefor. In the same way, a node point or junction of the load paths of the transistors 67 and 68 can be triggered by a similar configuration through a terminal 71.

In this way, an amplifier stage that is triggerable digitally in its amplification can be constructed with n amplification stages. The individual stages can naturally in turn include an arbitrary number of parallel connected series circuits of transistors of FIG. 1.

We claim:

1. A low-noise amplifier stage with reversible amplification in a cascode circuit, having a reference voltage source, comprising:

a reference potential terminal;

one first transistor and one second transistor having base terminals and having collector and emitter terminals defining load paths, a first resistor, the load paths of said one first and said one second transistors and said first resistor forming a first series circuit connected to said reference potential terminal;

at least one other first transistor and at least one other second transistor having base terminals and having collector and emitter terminals defining load paths being interconnected at least at one node point, at least one second resistor, the load paths of said at least one other first and said at least one other second transistors and said at least one second resistor forming at least one second series circuit connected to said reference potential terminal, said at least one second series circuit being connected parallel to said first series circuit;

a supply voltage terminal;

an oscillator circuit connected to said supply voltage terminal;

an output terminal connected through said oscillator circuit to said supply voltage terminal;

the collector terminals of said first transistors being connected parallel to said series circuits and being coupled to said output terminal;

first and second reference voltage sources, said first reference voltage source supplying the base terminals of said first transistors of said series circuits, and said second reference voltage supplying the base terminals of said second transistors of said series circuits;

an input terminal being coupled to the base terminals of said second transistors of said series circuits; and at least one reversing means connecting the at least one node point of the load paths of said transistors of said at least one second series circuit to said supply voltage terminal as a function of a control signal.

2. The amplifier stage according to claim 1, wherein said parallel-connected at least one first and at least one second transistors of said at least one second series circuit are a multiplicity of parallel-connected first and second transistors of a multiplicity of second series circuits.

3. The amplifier stage according to claim 1, including a choke connected between said second reference voltage source and the base terminals of said second transistors of said series circuits.

* * * * *